United States Patent
Huang

(10) Patent No.: US 11,929,593 B2
(45) Date of Patent: Mar. 12, 2024

(54) LASER PUMPING DEVICE AND SYSTEM INCLUDING GEOMETRIC LIGHT CONCENTRATOR AND THERMAL INSULATOR

(71) Applicant: NATIONAL TSING HUA UNIVERSITY, Hsinchu (TW)

(72) Inventor: Yen-Chieh Huang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 133 days.

(21) Appl. No.: 17/374,975

(22) Filed: Jul. 13, 2021

(65) Prior Publication Data

US 2023/0028158 A1    Jan. 26, 2023

(51) Int. Cl.
*H01S 5/04*    (2006.01)
*H01S 3/091*    (2006.01)
(Continued)

(52) U.S. Cl.
CPC .......... *H01S 5/4025* (2013.01); *H01S 3/091* (2013.01); *H01S 5/02423* (2013.01); *H01S 5/041* (2013.01)

(58) Field of Classification Search
CPC .... H01S 5/4025; H01S 5/02423; H01S 5/041; H01S 3/094084; H01S 5/141;
(Continued)

(56) References Cited

U.S. PATENT DOCUMENTS 5,307,430 A    4/1994   Beach et al.
5,854,802 A * 12/1998   Jin .......................... H01S 3/109
                                                            372/75
(Continued)

FOREIGN PATENT DOCUMENTS

CN       1822452 A     8/2006
CN     101282021 A    10/2008
(Continued)

OTHER PUBLICATIONS

Adrien Barbet et al., "Light-emitting diode pumped luminescent concentrators: a new opportunity for low-cost solid-state lasers", Optica, published on May 2, 2016, vol. 3, issue 5, pp. 465-468, published by Optical Society of America, United States.
Brenden Villars et al., "Design and development of a high-power LED-pumped Ce:Nd:YAG laser", Optics Letters, published on Jun. 23, 2015, vol. 40, issue 13, pp. 3049-3052, published by Optical Society of America, United States.
(Continued)

*Primary Examiner* — Xinning(Tom) Niu
(74) *Attorney, Agent, or Firm* — CKC & Partners Co., LLC

(57) ABSTRACT

A high-efficiency laser pumping device is provided, wherein a dielectric with or without a tapered aperture is used to accept, guide, and concentrate a pump light toward a laser gain material. Preferably, the dielectric is also a heat insulator between the pump-light source and the laser gain material. The pump-light source includes an array of light-emitting diodes, or an array of laser diodes, or an array of mixed light-emitting-diodes and laser diodes. Preferably, the input and output faces of the dielectric are optically coated with dielectric layers to maximize the pump brightness toward the laser gain material. A high-efficiency laser-pumping system with active cooling apparatus is further provided, wherein a plural number of the optical-guiding and thermal-insulation dielectrics are arranged to receive the pump lights from a plural number of pump-light sources, configured to concentrate all the pump light toward a laser gain material.

15 Claims, 9 Drawing Sheets

(51) Int. Cl.
*H01S 5/024* (2006.01)
*H01S 5/40* (2006.01)

(58) Field of Classification Search
CPC .. H01S 3/094057; H01S 3/061; H01S 3/0407; H01S 3/0941; H01S 3/091; H01S 3/1115; H01S 3/06745; H01S 3/06791; H01S 3/06704; H01S 3/1118; H01S 3/06712; H01S 3/094003; H01S 3/09415; H01S 3/1112; H01S 3/1608

See application file for complete search history.

(56) References Cited

U.S. PATENT DOCUMENTS

| | | | | |
|---|---|---|---|---|
| 5,978,407 | A | * | 11/1999 | Chang .................. H01S 3/0941 372/72 |
| 7,046,710 | B2 | | 5/2006 | Spariosu et al. |
| 2003/0161365 | A1 | * | 8/2003 | Perry ...................... H01S 3/20 372/39 |
| 2005/0111510 | A1 | | 5/2005 | Gong et al. |
| 2010/0111121 | A1 | | 5/2010 | Takeshita et al. |
| 2010/0195676 | A1 | * | 8/2010 | Shakir ..................... G02B 6/26 385/33 |
| 2012/0165801 | A1 | | 6/2012 | Bragagna et al. |
| 2013/0208753 | A1 | * | 8/2013 | van Leeuwen ....... H01S 3/0941 372/72 |
| 2016/0322775 | A1 | * | 11/2016 | Fan .................. H01S 3/094057 |
| 2017/0149197 | A1 | | 5/2017 | Hill et al. |
| 2020/0412082 | A1 | | 12/2020 | Mirkov et al. |

FOREIGN PATENT DOCUMENTS

| | | | | |
|---|---|---|---|---|
| CN | 101320880 | A | 12/2008 | |
| CN | 102484346 | A | 5/2012 | |
| CN | 103762490 | A | 4/2014 | |
| CN | 203645130 | U | 6/2014 | |
| CN | 104428961 | A | 3/2015 | |
| CN | 106253035 | A | 12/2016 | |
| JP | H0794813 | A | * 4/1995 | ............. H01S 3/061 |
| WO | 2009109978 | A1 | 9/2009 | |

OTHER PUBLICATIONS

Chun Yu Cho et al., "LED-side-pumped Nd:YAG laser with >20% optical efficiency and the demonstration of an efficient passively Q-switched LED-pumped solid-state laser", Optics Letters, published on Jun. 14, 2017, vol. 42, issue 12, pp. 2394-2397, published by Optical Society of America, United States.

Kozo Kamiryo et al., "Optimum Design of Elliptical Pumping Chambers for Solid Lasers", Japanese Journal of Applied Physics, published in Dec. 1966, vol. 5, No. 12, pp. 1217-1226, published by The Japan Society of Applied Physics, Japan.

Shuichi Fujikawa et al., "28% electrical-efficiency operation of a diode-side-pumped Nd:YAG rod laser", Optics letters, published on May 1, 2001, vol. 26, issue 9, pp. 602-604, published by Optical Society of America, United States.

* cited by examiner

LASER PUMPING DEVICE AND SYSTEM INCLUDING GEOMETRIC LIGHT CONCENTRATOR AND THERMAL INSULATOR

BACKGROUND

Technical Field

The present disclosure relates to a laser pumping device and system thereof including a dielectric block, being a geometric light concentrator and heat insulator, and, in particular, relates to one or an array of low-thermal-conductivity optical dielectrics, which guide and concentrate low-intensity light from light-emitting diodes or laser diodes to generate high-brightness light to pump a laser gain material with higher efficiency and less heat in the laser crystal.

Description of Related Art

A laser is a high-energy density radiation device containing a laser gain material pumped by an energy source. There are various types of pump sources to a laser. For instance, an electric source can deliver electric energy to pump a semiconductor laser (also dubbed as a laser diode); a laser diode can then pumps a solid-state laser; a flash lamp is often used to pump a high-power pulse laser, etc. To be efficient, the pump energy has to be efficiently absorbed by the laser gain material. Therefore, there are two key factors to achieve high pump efficiency. The first is to have a high pump intensity matched to the emission volume of the laser. The second is to have a pump spectrum matched to the absorption spectrum of the laser gain material. Together, the two factors define the brightness or the brilliance of a pump source, in units of light power per unit area, per unit solid angle, and per unit bandwidth. Since a laser diode can emit a narrow-line high-intensity focused radiation matched to the absorption peak of a laser gain material, a diode-laser pumped (abbreviated as "diode-pumped" for what follows) solid-state laser is known to be very efficient. Although a flash-lamp source is relative low-cost, the broadband and diverging light from it cannot pump a solid-state laser as efficiently as a diode-pumped laser. It is known in the art (Kozo Kamiryo et al. 1966 Jpn. J. Appl. Phys. 5 1217) that a geometric improvement for the pump efficiency is to install a flash-lamp tube along one of the foci of an elliptical pump chamber and install a laser rod along the other, so that the pump light of the flash lamp can mostly reach the laser gain material.

Recently, light-emitting diode is emerging as a pump source for a solid-state laser (see, for instance, Brenden Villars et al., 2015 Optics Letts. 40 3049). A light-emitting diode emits a diverging light with a much smaller spectral width than a flash lamp and a slightly broader one than a laser diode. Therefore, the spectral energy of a light-emitting diode is better matched to the spectral absorption of a laser gain material than that of a flash lamp. A light-emitting diode also has a much longer lifetime and better stability than a flash lamp. Compared with laser diodes for pumping a solid-state laser, a light-emitting diode is lower cost in installation and maintenance, less susceptible to electrostatic damage, and less sensitive to temperature variation. However, unlike as a laser diode, a light-emitting diode does not generate a focused light. A light-emitting diode or an array of light-emitting diodes emits a forward radiation with a cone angle of about 120 degrees. Since light-emitting diodes cannot be made into a strong tube emitter like a flash lamp, an elliptical pump chamber commonly adopted by a flash lamp in the prior art is not suitable for a light-emitting-diode pumped solid-state laser. To address this issue, some geometric reflection structures were invented in the Patent, US 2017/0149197 A1, to confine the light-emitting-diode pump light with a fairly inefficient light-volume-to-laser-volume ratio. To further concentrate the pump energy from light-emitting diodes, Adrien Barbet et al. (Optica 3, (2016) 465) first converted blue-light light-emitting diodes to luminescent emission in a film material. The luminescence is guided in the film to propagate with a high intensity toward a laser crystal. Unfortunately, most of the light-emitting-diode light in their work was not converted to the pump luminesce and the overall pump efficiency remains low.

To obtain a high pump intensity, one would install a light-emitting diode as close as possible to a laser gain material (for instance, Chun Yu Cho et al., 2017 Optics Letts. 42 2394). However, a laser relies on population inversion to achieve a lasing threshold. If the ground state of a laser gain material is thermally populated with many atoms, it becomes difficult for the upper-state atoms to reach population inversion. Like all other pump sources, a light-emitting diode generates heat, which prevents the light-emitting diode from being installed in the proximity of a laser gain material for efficient pumping. In a diode-laser pumped solid-state laser, coupling a laser diode into an optical fiber to pump a gain material some distance away is often the choice to insulate the heat of the pump source from the laser. Unfortunately, such a technique is not suitable for light-emitting-diode pumping, because coupling a highly diverging and weak light-emitting-diode light into an optical fiber is very inefficient when compared to coupling a laser-diode light into an optical fiber.

Therefore, it is an intention of the present disclosure to provide a new laser pumping device and its embodiments that can effectively concentrate the light from, for instance, light emitting diodes, for pumping a laser and yet mitigate the heat of the pump-light source from reaching the laser gain material. It is also an additional purpose of the present disclosure to increase the brilliance of the pump light of a laser, so as to increase the pump efficiency of a laser.

SUMMARY

In accordance with one aspect of the present disclosure, a laser pumping device includes a pump-light source, a dielectric block, and a laser gain material. The pump-light source is configured to emit a pump light. The dielectric block with a pump axis includes a first surface, a second surface, and a plural number of reflection surfaces. The dielectric block is configured to receive the pump light into the first surface, guide the pump light along the pump axis surrounded by the reflection surfaces, and transmit the pump light toward the second surface. The laser gain material is installed at a position next to the second surface close to the pump axis and configured to receive and absorb the pump light emitted from the second surface.

In accordance with another aspect of the present disclosure, a laser pumping system includes a plural number of the aforementioned pump-light sources, a plural number of the aforementioned dielectric blocks, the aforementioned laser gain material and a cooling apparatus. The pump-light sources are configured to respectively emit a plural number of the aforementioned pump lights. The dielectric blocks are configured to respectively transmit the pump lights and insulate heat of the pump-light sources. The laser gain material is configured to receive and absorb the pump lights.

The cooling apparatus is configured to remove heats generated in the pump-light sources and the laser gain material.

BRIEF DESCRIPTION OF THE DRAWINGS

The present disclosure can be more fully understood by reading the following detailed description of the embodiment, with reference made to the accompanying drawings as follows.

DETAILED DESCRIPTION

The present disclosure will now be described more specifically with reference to the following embodiments. It is to be noted that the following descriptions of preferred embodiments of this disclosure are presented herein for the purposes of illustration and description only; it is not intended to be exhaustive or to be limited to the precise form disclosed.

Figure 1:
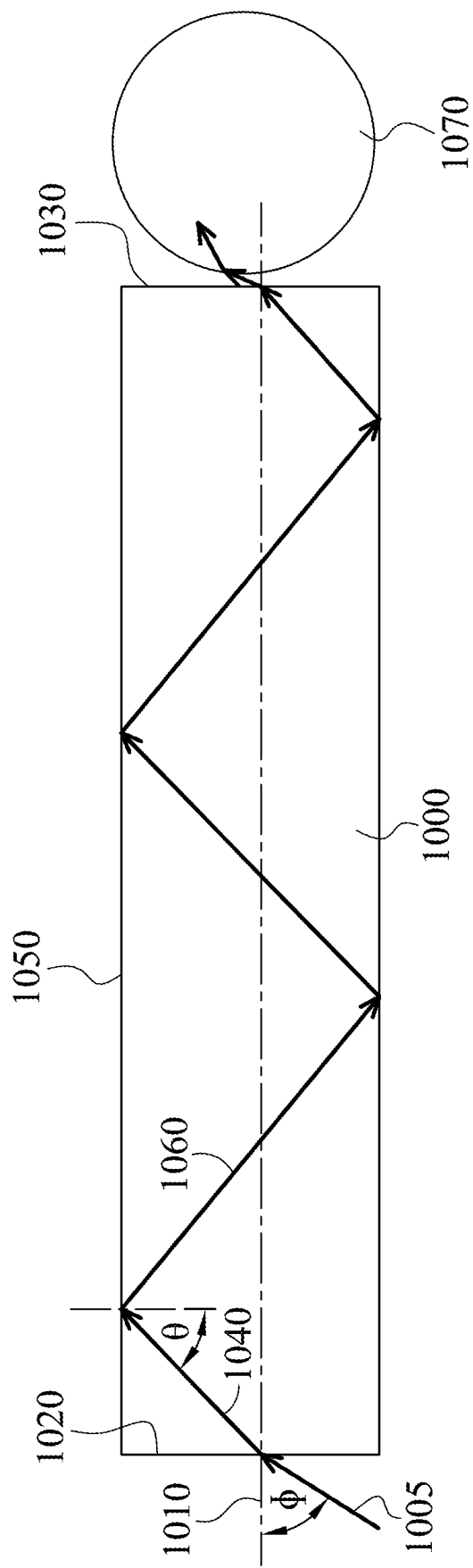
FIG. 1 is a schematic diagram illustrating the angular acceptance of a dielectric slab for a light ray to be guided between two parallel walls via total internal reflection.

FIG. 1 illustrates a dielectric block (i.e., an optical dielectric slab) 1000 having parallel walls (i.e., the top side wall 1050 and the wall parallel thereto) along a pump axis 1010. Each of the parallel walls is a reflection surface. An input ray 1005 of a pump light is incident on the first surface (i.e., the front surface, the input surface) 1020 at an incidence angle $\phi$ and the refracted ray 1040 of the input ray 1005 of the pump light is incident on the top side wall 1050 at an angle of $\theta$. For the reflected ray 1060 of the pump light to be guided without energy loss in the dielectric block 1000, the angle $\theta$ has to be larger than the critical angle $\theta_c$ of the total internal reflection angle, where $\theta_c = \sin^{-1}(n_a/n)$ with n being the refractive index of the dielectric block 1000 and $n_a$ being the refractive index of the environment. To achieve the condition $\theta > \theta_c$, according to the Snell's law, the input angle (i.e., incidence angle or the acceptance angle) $\phi$ has to satisfy the condition of Equation (1), given by:

$$\sin \phi < n \times \cos \theta_c = \sqrt{n^2 - n_a^2} \qquad (1).$$

To maximize the acceptance angle $\phi$, it is desirable to minimize $n_a$. To simplify the discussion, for what follows, $n_a$ is taken to be 1 for an air environment. The numerical aperture $NA_p$ of the dielectric block 1000 including the parallel walls is defined as the sine of the largest acceptance angle $\phi_{max}$, given by Equation (2):

$$NA_p = \sin \phi_{max} = \sqrt{n^2 - 1} \qquad (2).$$

The first insight of the present disclosure is to couple a highly diverging pump light into one or a plural of dielectric blocks with parallel walls having a large enough refractive index and thereby a large numerical aperture $NA_p$, which allows guiding and concentrating the light from the first surface 1020 to the second surface (i.e., the end surface, the output surface) 1030 for pumping a laser gain material 1070. Preferably, the dielectric block 1000 with the parallel walls has a low thermal conductivity for insulating the heat of the pump-light source from the laser gain material 1070. Preferably, both the first surface 1020 and the second surface 1030 are coated with anti-reflection dielectric layers to increase the transmission of the pump light through the dielectric block 1000 and toward the laser gain material 1070.

The pump light source can include or be light-emitting diodes, laser diodes, or a combination of the two. As previously explained, matching the pump wavelength to the absorption wavelength of the laser gain material 1070 can greatly enhance the pump efficiency for a laser. Although a light-emitting diode has a relatively narrower emission spectrum than that of a flash lamp, a laser diode has superior spectral brightness for laser pumping. To improve the spectral brightness of the light-emitting diode for laser pumping, in one of the preferred embodiments, the first surface 1020 is optically coated with dielectric layers having materials different from a material of the dielectric block 1000 to stimulate a light-emitting diode to emit a wavelength matched to the absorption wavelength of the laser gain material 1070.

Figure 2:
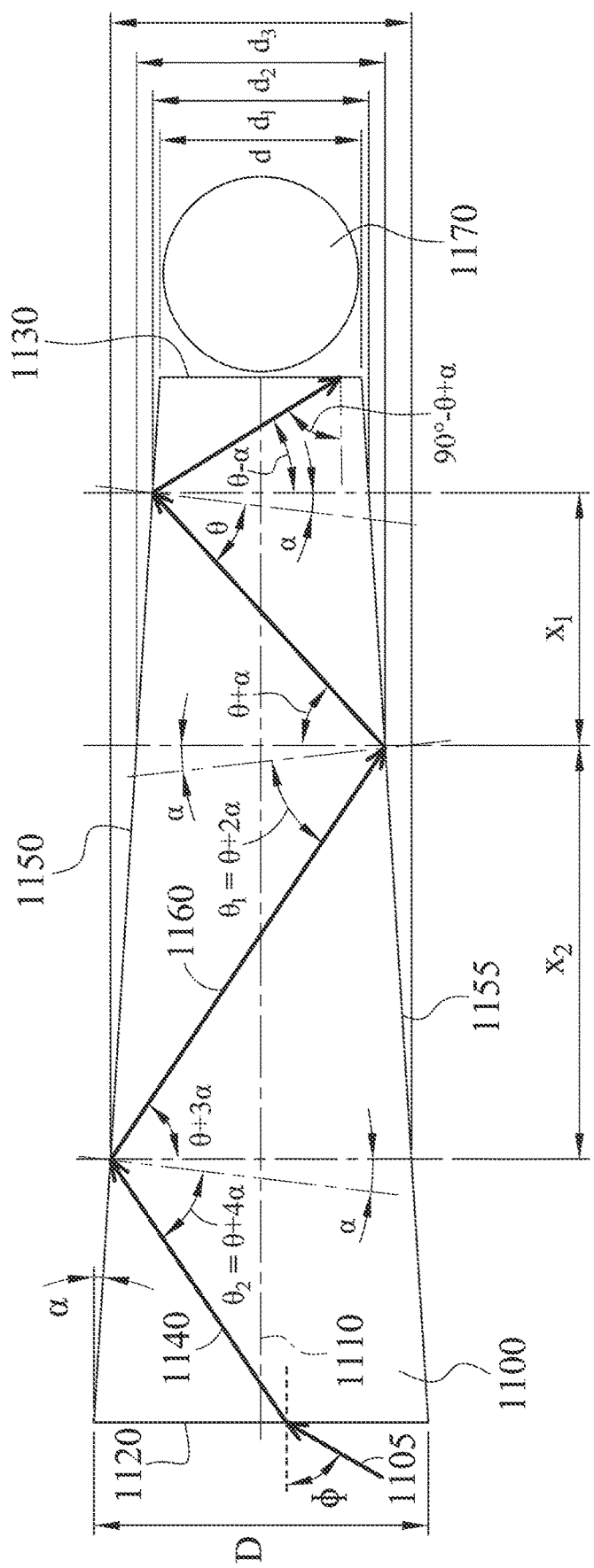
FIG. 2 shows a schematic diagram illustrating the increased light intensity and reduced angular acceptance of a dielectric slab for a light ray to be guided between two wedged walls via total internal reflection.

A further insight of the present disclosure is illustrated in FIG. 2. A wedged dielectric block 1100 couples the input ray 1105 of the pump light from the first surface 1120 to the second surface 1130. The first surface 1120 has a width D and the second surface 1130 has a width of d, where D≥d due to the wedge angle α≥0. Ideally, this dielectric block 1100 is highly transparent to the pump light and can concentrate the pump light incident on the first surface 1120 toward the second surface 1130. Preferably, this dielectric block 1100 has a low thermal conductivity to insulate the heat of the pump-light source from the laser gain material 1170. If all parts of the pump light incident on the first surface 1120 can propagate and reach the second surface 1130, the intensity of the pump light will increase by a geometric factor of D/d.

However, the angular acceptance of an optical system is determined by the numerical aperture NA of the system. With a finite wedge angle α, the numerical aperture NA reduces from a value with α=0, as the incident angle of the refracted ray 1140 of the pump light at the side walls (as reflection surfaces) 1150 and 1155 becomes progressively small and could eventually violate the total internal reflection condition for optical guiding. Assume that the incidence angle of the last bounce to reach the second surface 1130 is θ. From the geometry in FIG. 2, the incidence angle $\theta_N$ of the light ray at the $N^{th}$ previous bounce is given by Equation (3):

$$\theta_N = \theta + 2N\alpha, \ N=1,2,3 \ldots \quad (3).$$

Suppose the refracted ray 1140 takes N bounces to reach the second surface 1130. The condition for an input ray 1105 to be guided inside the dielectric 1100 is the condition for the last angle θ to remain larger than the critical angle $\theta_c$ of total internal reflection or $\theta > \theta_c$. According to the Snell's law, this condition is given in Equation (4):

$$\sin\phi = n\,\sin(90° - \theta_N) = n\,\cos(\theta + 2N\alpha) \quad (4).$$

In Equation (4), φ is the incidence angle of the input ray 1105 on the first surface 1120. The $NA_w$ of the wedged dielectric is therefore described by Equation (5):

$$NA_w = \sin\phi_{max} = n\,\cos(\theta_c + 2N\alpha) \quad (5).$$

By comparing Equations (2) and (5), $NA_w$ is always smaller than $NA_p$ for a finite Nα. It is therefore the intention of the present disclosure to take advantage of the wedged dielectric for concentrating the pump light and insulating the pump-light-source heat based on a prudent design of the $NA_w$ subject to Equation (5).

From the geometry, the total length L of the wedged dielectric along the pump axis 1110 can be calculated from the summation of length segments $x_i$, given by Equation (6):

$$L = \sum_{i=1}^{N} x_i, \text{ where } x_i = \frac{d_i \tan(\theta + (2i-1)\alpha)}{1 - \tan\alpha\tan(\theta + (2i-1)\alpha)} \text{ and} \quad (6)$$

$$d_i = d_{i-1} + 2x_{i-1}\tan\alpha, \ d_0 = d, \ d_N = D, \ \theta \geq \theta_C.$$

In Equation (6), width $d_i$ is also defined, one can set the boundary condition $d_0 = d$ at the second surface 1130 and leave the width D at the first surface 1120, to be determined by the size of the pump-light emitter, and N is a maximum integer number of i subject to a maximum $i^{th}$ width section $d_i = D$ at the first surface 1120. Equations (5)-(6) together provide precise guidelines for designing an effective pump-light concentrator and heat insulator to pump a solid-state laser gain material 1170.

Preferably, at least one of the first surface 1120 and the second surface 1130 is coated with anti-reflection dielectric layers to increase the transmission of the pump light through the dielectric block 1100 and toward the laser gain material 1170.

The pump-light source can include or be light-emitting diodes, laser diodes, or a combination of the two. To improve the spectral brightness of light-emitting diodes for laser pumping, in one of the preferred embodiments, the first surface 1120 is optically coated with dielectric layers having materials different from a material of the dielectric block 1100 to stimulate the light-emitting diode to emit a wavelength matched to the absorption wavelength of the laser gain material 1170.

Figure 3:
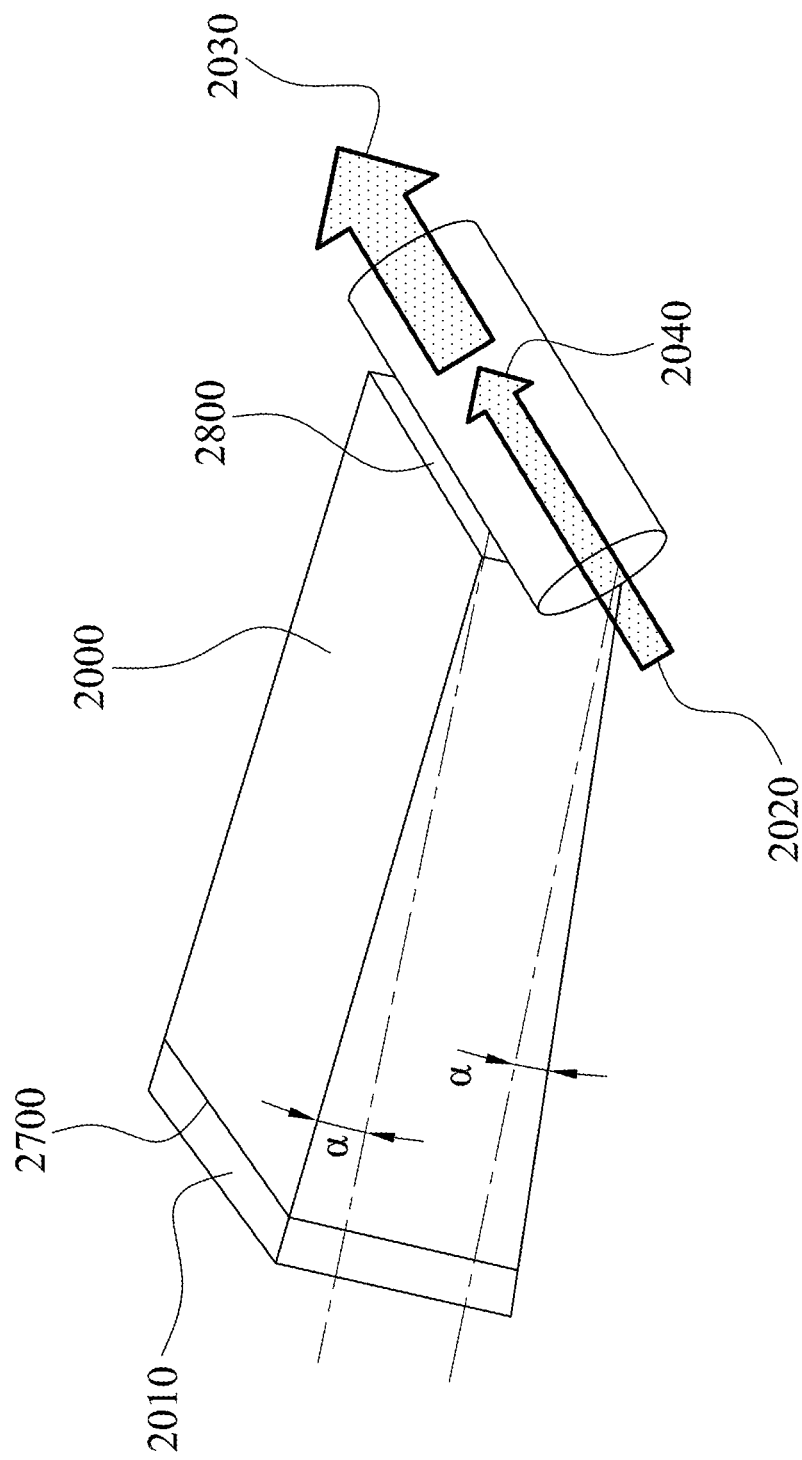
FIG. 3 is a schematic diagram showing a singly wedged optical dielectric for concentrating a pump light toward a laser gain material in a laser amplifier, according to the 1st embodiment of the present disclosure of a laser pumping device.
Figure 4:
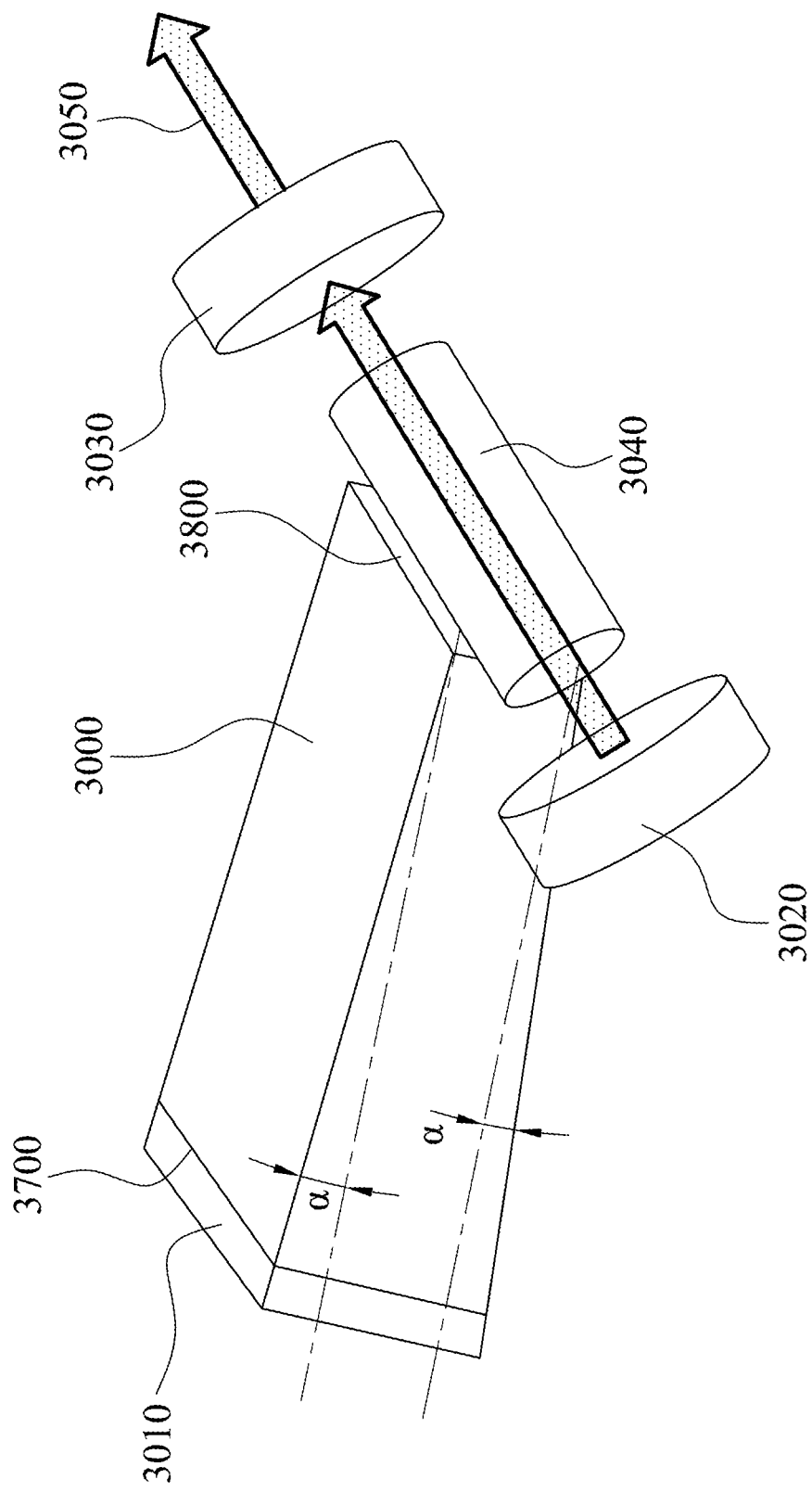
FIG. 4 is a schematic diagram showing a singly wedged optical dielectric for concentrating a pump light toward a laser gain material in a laser oscillator, according to the 2nd embodiment of the present disclosure of a laser pumping device.
Figure 7:
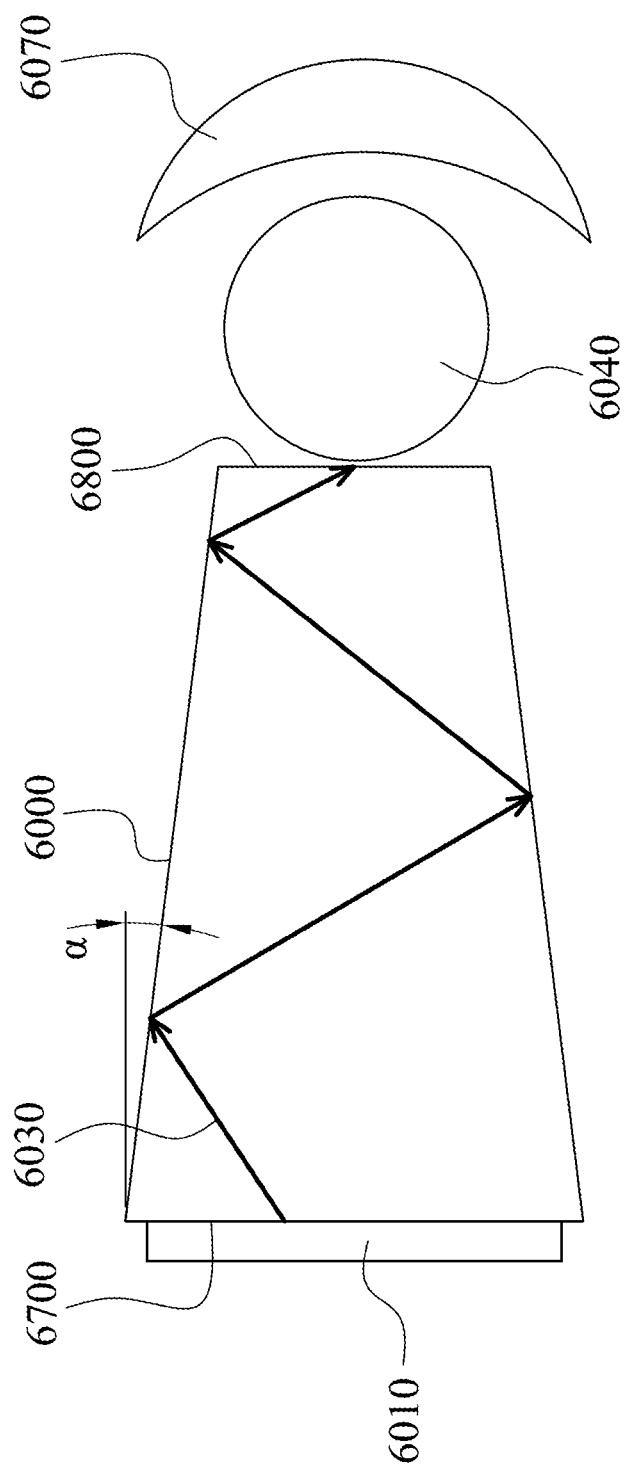
FIG. 7 is a schematic diagram showing the side view of a light concentrator and heat insulator for pumping a laser gain material with a reflecting mirror to recycle the unabsorbed pump light back into the gain material, according to the 5th embodiment of the present disclosure of a laser pumping device.
Figure 8:
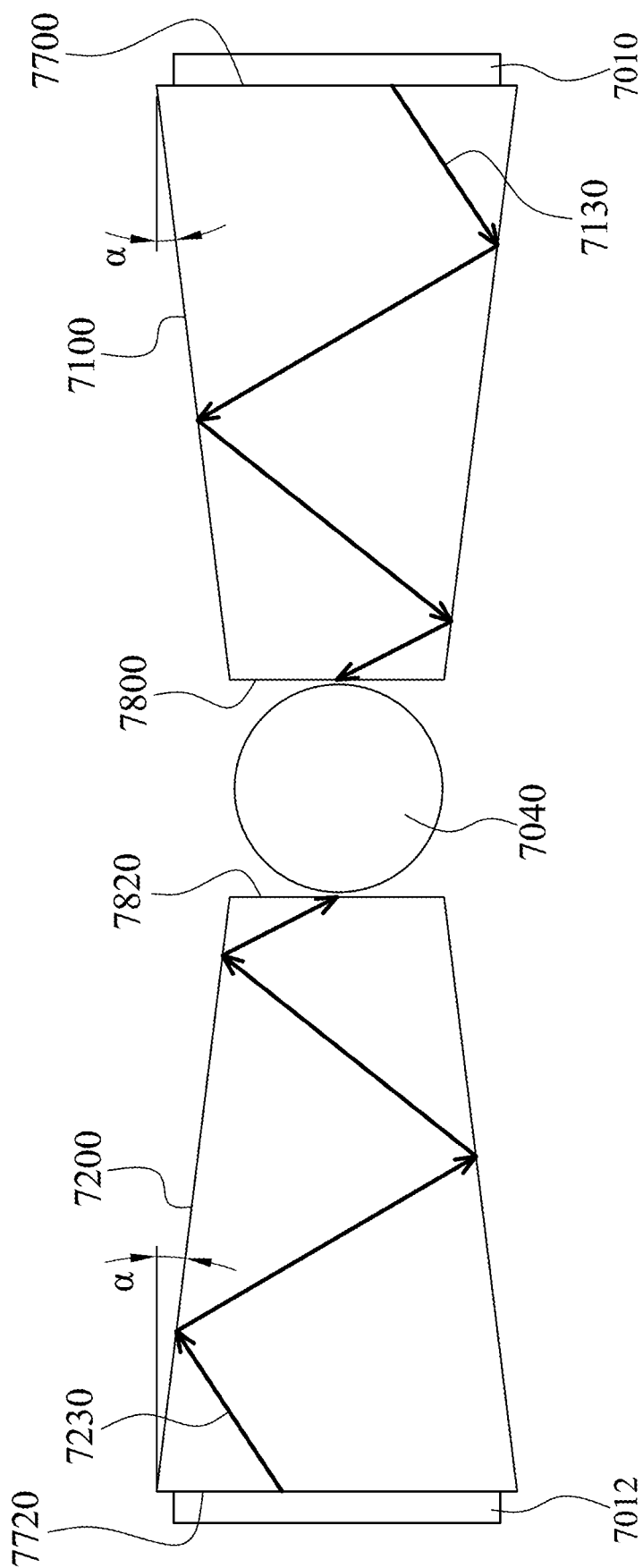
FIG. 8 is a schematic diagram showing the side view of two modules of light concentrator and heat insulator for pumping a laser gain material, according to the 6th embodiment of the present disclosure of a laser pumping system.
Figure 9:
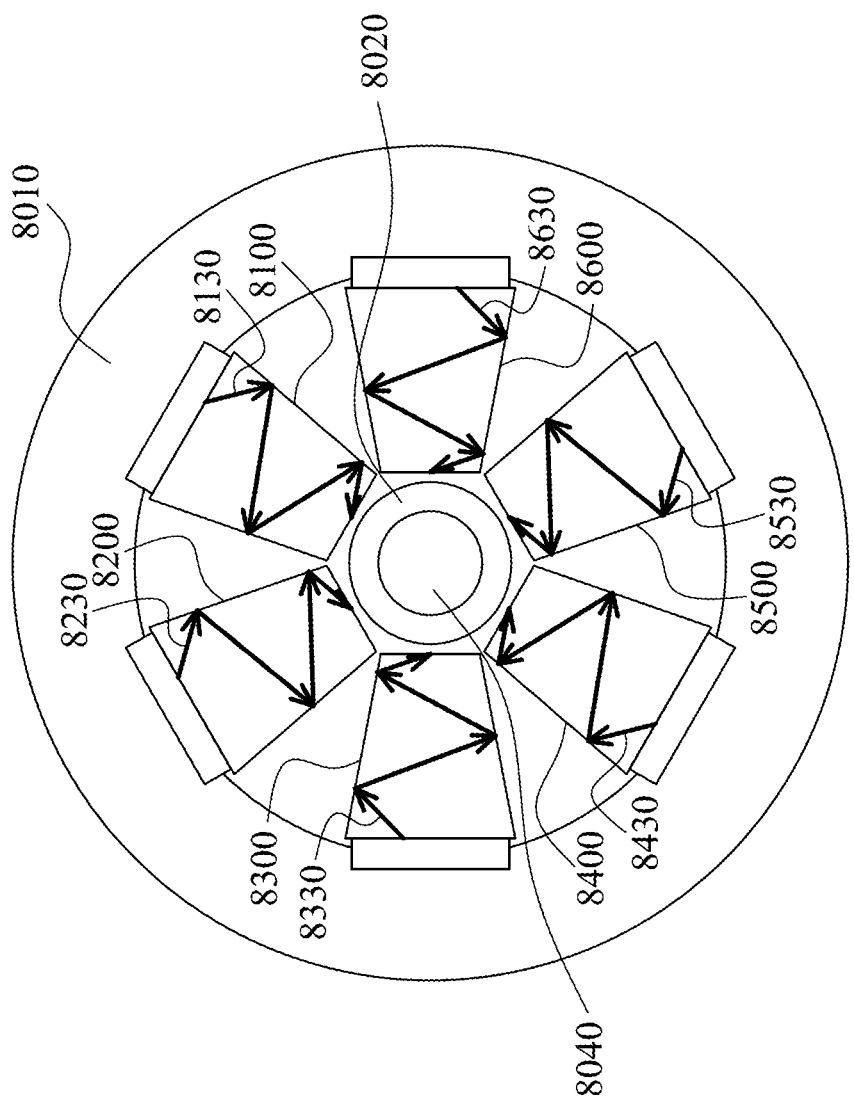
FIG. 9 is a schematic diagram showing the side view of multiple modules of light concentrator and heat insulator for pumping a laser gain material arranged with cooling apparatus to the light source and the laser rod, according to the 7th embodiment of the present disclosure of a laser pumping system.

The optical dielectric blocks 1000 and 1100 in FIGS. 1 and 2, respectively, can be the building blocks to concentrate the pump light on and insulate the pump-light-source heat from the laser gain material 1070 and 1170. In the case of a wedged dielectric block, the geometric scaling factor D/d of the pump intensity for a singly wedged dielectric block, as shown in FIGS. 3 and 4, can be increased to the square of it by adopting the doubly wedged dielectric block shown in FIGS. 5 and 6. In FIG. 7, to enhance the pump efficiency, an embodiment of the present disclosure is to install a reflecting mirror 6070 behind the laser gain material (a laser rod, for instance) 6040, so that the unabsorbed pump light is re-directed back to pump the laser gain material 6040. As shown in FIGS. 8 and 9, the geometric scaling factor of the pump intensity can be further multiplied by installing a plural number of the wedged dielectric blocks (e.g., dielectric blocks 7100, 7200 in FIG. 8) around a laser gain material (e.g., a laser gain material 7040 in FIG. 8). Therefore, the present disclosure provides an innovative optical device and its embodiments to scale up the intensity of pump lights for pumping a solid-state laser with effective thermal insulation between the pump and the laser gain material.

With reference to each of FIGS. 3 to 9 of the 1st to 7th embodiments, respectively, the pump-light source may include an array of light-emitting-diode dies, laser-diode dies, or a combination of the two. A material of the dielectric block may be transparent to the pump light and one among glass, quartz, and fused silica. Therefore, the dielectric block has high optical transparency to transmit the pump light to reach the laser gain material and the dielectric block has low thermal conductivity to insulate the heat of the pump-light source from reaching the laser gain material. At least one of the first and second surfaces of the dielectric block may be optically coated with anti-reflecting dielectric layers to increase a transmission of the pump light through the dielectric block. To increase the spectral brightness of the light-emitting-diode pump light, the first surface of the dielectric block may be optically coated with dielectric layers having materials different from a material of the dielectric block to stimulate an emission of the light-emitting diode at an absorption wavelength of the laser gain material, so as to increase the efficiency for a light-emitting-diode pumped laser. The laser gain material of any of the 1st to 7th embodiments may be one among Nd:YAG, Nd:YVO$_4$, Nd:GdVO$_4$, Nd:KGW, Nd:YLF, Nd:glass, Cr:YAG, Cr:LiSAF, Yb:YAG, Yb:glass, Er:YAG, Er:glass, Tm:glass, and Ti:sapphire crystals. Therefore, the laser gain material is advantageous in emitting a laser or amplifying a laser radiation, when pumped by the concentrated pump lights.

With reference to FIG. 3 of the 1st embodiment, the laser pumping device includes the pump-light source (i.e., the pump-light illuminator) 2010, the dielectric block 2000, and the laser gain material (the laser gain material unit; for instance, a laser rod) 2040. The pump-light source 2010 is configured to emit a pump light. The pump-light source can be light-emitting diodes, laser diodes, or a combination of the two. The dielectric block 2000 with the pump axis includes the first surface 2700, the second surface 2800, and a plural number of reflection surfaces, which are disposed about the pump axis and between the first surface 2700 and the second surface 2800. The dielectric block 2000 is configured to receive the pump light into the first surface 2700, guide the pump light along the pump axis surrounded by the reflection surfaces, and transmit the pump light toward the second surface 2800. The laser gain material 2040 is installed at a position next to the second surface 2800 close to the pump axis and configured to receive and absorb the pump light emitted from the second surface 2800. Therefore, the dielectric block 2000 is advantageous of serving as a high-efficiency geometric light concentrator and heat insulator for laser pumping.

In detail, oppositely faced two of the reflection surfaces of the dielectric block 2000 are wedged with a down-tapered aperture (i.e., cross-sectional area) perpendicular to the pump axis, each having a wedge angle of a, as shown in FIG. 3. In other words, the dielectric block 2000 has an input aperture (i.e., the first surface 2700) larger than an output aperture (i.e., the second surface 2800), and the pump light is incident on the larger input aperture and concentrated toward the laser gain material 2040 at the smaller output aperture. The laser gain material 2040 is installed in a laser amplifier to amplify a weak input laser 2020 at the input and generate a strong output laser 2030 at the output.

With reference to FIG. 4 of the 2nd embodiment, the laser pumping device includes the pump-light source 3010, the dielectric block 3000, and the laser gain material 3040. The pump-light source 3010 is configured to emit a pump light. The pump-light source can be light-emitting diodes, laser diodes, or a combination of the two. The dielectric block 3000 with the pump axis includes the first surface 3700, the second surface 3800, and a plural number of reflection surfaces, which are disposed about the pump axis and between the first surface 3700 and the second surface 3800. The dielectric block 3000 is configured to receive the pump light into the first surface 3700, guide the pump light along the pump axis surrounded by the reflection surfaces, and transmit the pump light toward the second surface 3800. The laser gain material 3040 is installed at a position next to the second surface 3800 close to the pump axis and configured to receive and absorb the pump light emitted from the second surface 3800.

In detail, oppositely faced two of the reflection surfaces of the dielectric block 3000 are wedged with a down-tapered aperture perpendicular to the pump axis, each having a wedge angle of α, as shown in FIG. 4. The laser gain material 3040 is installed in a laser cavity. Specifically, there are a laser cavity mirror 3020 disposed in an input end of the laser gain material 3040, and an output coupler 3030 disposed in an output end of the laser gain material 3040, so as to build up an output laser 3050 emitted from the laser gain material 3040.

Figure 5:
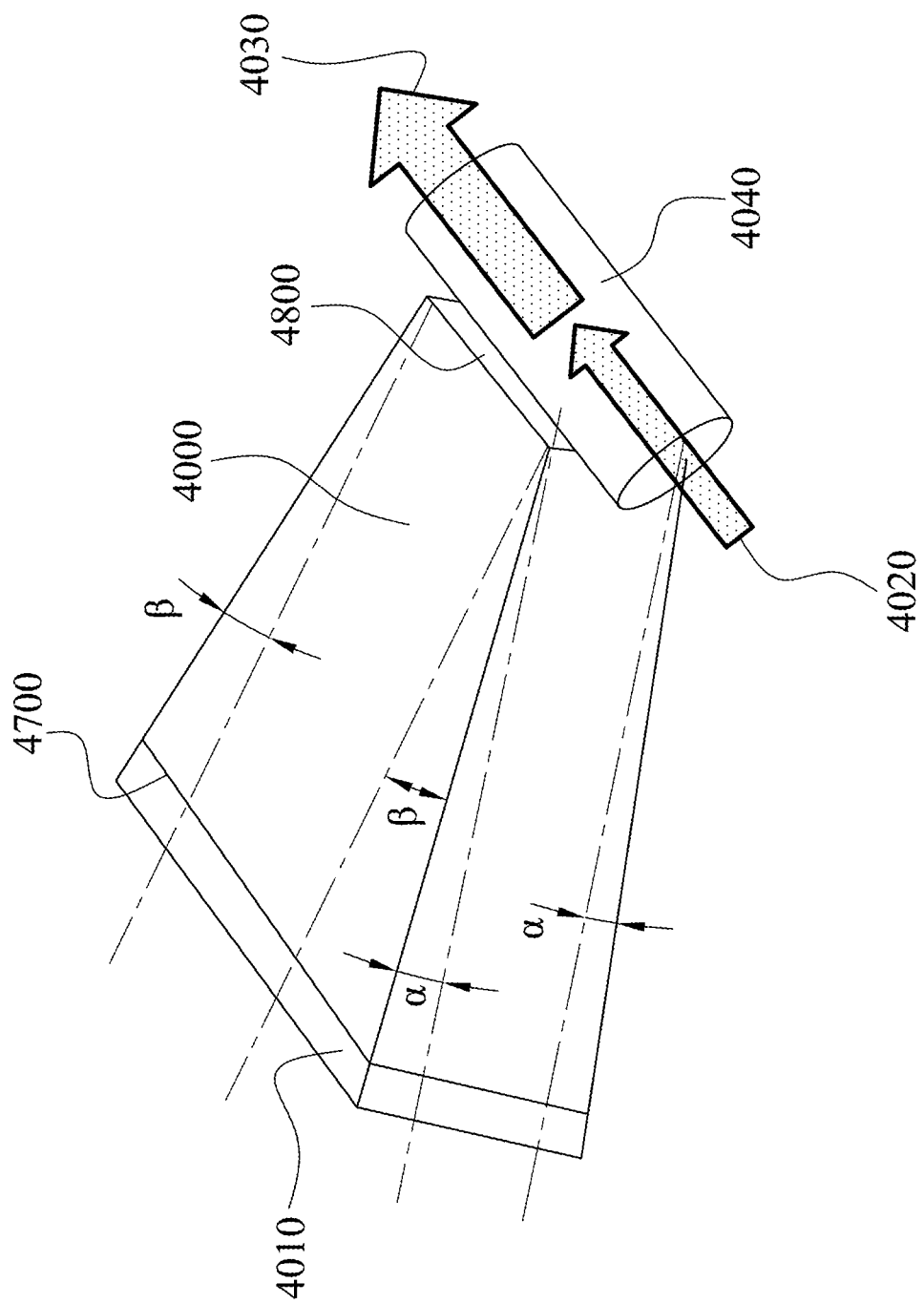
FIG. 5 is a schematic diagram showing a doubly wedged optical dielectric for concentrating a pump light toward a laser gain material in a laser amplifier, according to the 3rd embodiment of the present disclosure of a laser pumping device.

With reference to FIG. 5 of the 3rd embodiment, the laser pumping device includes the pump-light source 4010, the dielectric block 4000 and the laser gain material 4040. The pump-light source 4010 is configured to emit a pump light. The pump-light source can be light-emitting diodes, laser diodes, or a combination of the two. The dielectric block 4000 with the pump axis includes the first surface 4700, the second surface 4800, and a plural number of reflection surfaces, which are disposed about the pump axis and between the first surface 4700 and the second surface 4800. The dielectric block 4000 is configured to receive the pump light into the first surface 4700, guide the pump light along the pump axis surrounded by the reflection surfaces, and transmit the pump light toward the second surface 4800. The laser gain material 4040 is installed at a position next to the second surface 4800 close to the pump axis and configured to receive and absorb the pump light emitted from the second surface 4800.

In detail, as shown in FIG. 5, oppositely faced two of the reflection surfaces of the dielectric block 4000 are wedged with a down-tapered aperture perpendicular to the pump axis, each having a side wedge angle of α. The other oppositely faced two of the reflection surfaces of the dielectric block 4000 are wedged with a down-tapered aperture perpendicular to the pump axis, each having a top wedge angle of β. The laser gain material 4040 is installed in a laser amplifier to amplify a weak input laser 4020 at the input and generate a strong output laser 4030 at the output.

Figure 6:
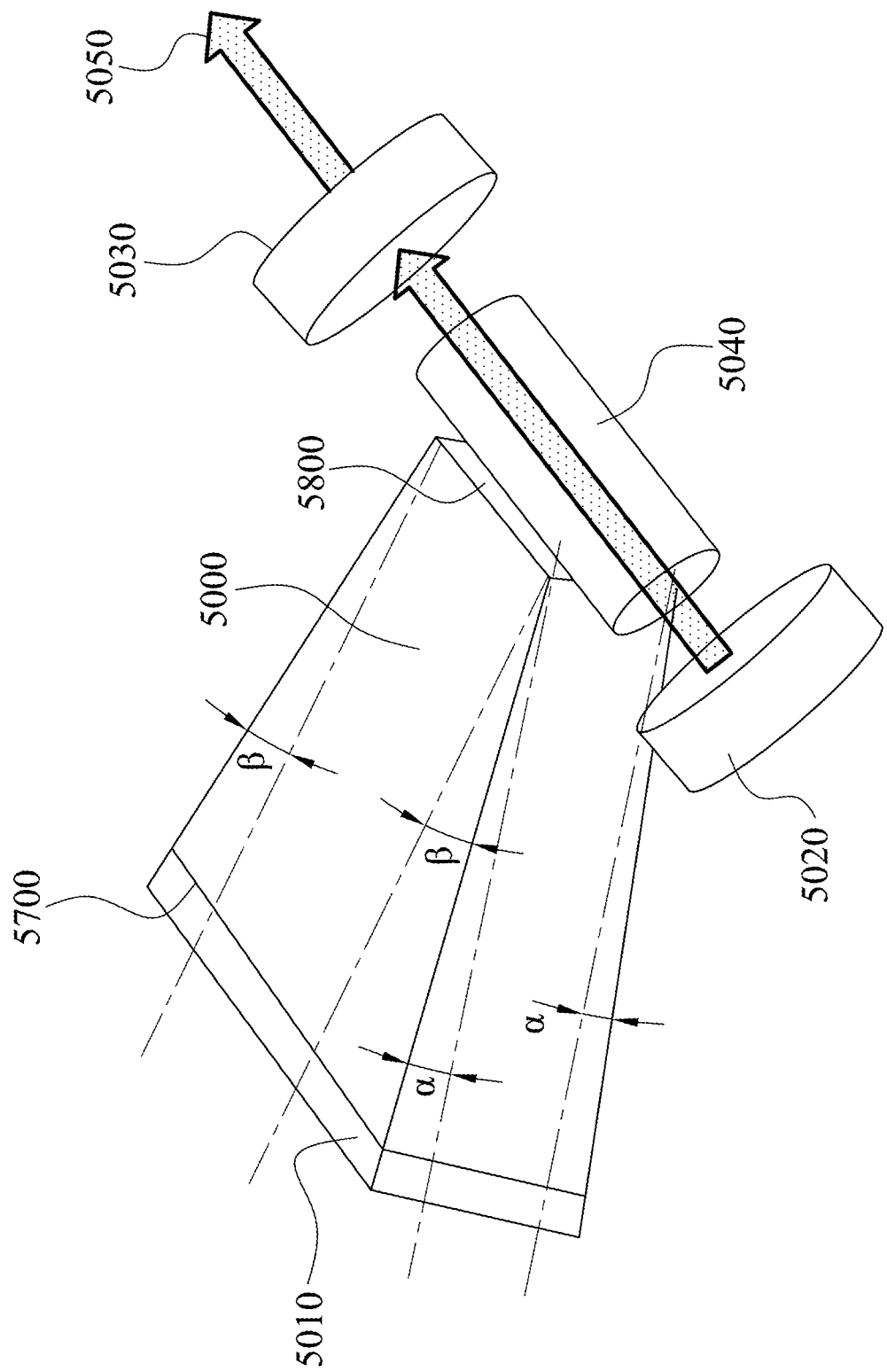
FIG. 6 is a schematic diagram showing a doubly wedged optical dielectric for concentrating a pump light toward a laser gain material in a laser oscillator, according to the 4th embodiment of the present disclosure of a laser pumping device.

With reference to FIG. 6 of the 4th embodiment, the laser pumping device includes the pump-light source 5010, the dielectric block 5000, and the laser gain material 5040. The pump-light source 5010 is configured to emit a pump light. The pump-light source can be light-emitting diodes, laser diodes, or a combination of the two. The dielectric block 5000 with the pump axis includes the first surface 5700, the second surface 5800, and a plural number of reflection surfaces, which are disposed about the pump axis and between the first surface 5700 and the second surface 5800. The dielectric block 5000 is configured to receive the pump light into the first surface 5700, guide the pump light along the pump axis surrounded by the reflection surfaces, and transmit the pump light toward the second surface 5800. The laser gain material 5040 is installed at a position next to the second surface 5800 close to the pump axis and configured to receive and absorb the pump light emitted from the second surface 5800.

In detail, as shown in FIG. 6, oppositely faced two of the reflection surfaces of the dielectric block 5000 are wedged with a down-tapered aperture perpendicular to the pump axis, each having a side wedge angle of α. The other oppositely faced two of the reflection surfaces of the dielectric block 5000 are wedged with a down-tapered aperture perpendicular to the pump axis, each having a top wedge angle of β. The laser gain material 5040 is installed in a laser cavity. Specifically, there are a laser cavity mirror 5020 disposed in an input end of the laser gain material 5040, and an output coupler 5030 disposed in an output end of the laser gain material 5040, so as to build up an output laser 5050 emitted from the laser gain material 5040.

With reference to FIG. 7 of the 5th embodiment, the laser pumping device includes the pump-light source 6010, the dielectric block 6000 and the laser gain material 6040. The pump-light source 6010 is configured to emit a pump light 6030. The pump-light source can be light-emitting diodes, laser diodes, or a combination of the two. The dielectric block 6000 with the pump axis includes the first surface 6700, the second surface 6800, and a plural number of reflection surfaces, which are disposed about the pump axis and between the first surface 6700 and the second surface 6800. The dielectric block 6000 is configured to receive the pump light 6030 into the first surface 6700, guide the pump light 6030 along the pump axis surrounded by the reflection surfaces, and transmit the pump light 6030 toward the second surface 6800. The laser gain material 6040 is installed at a position next to the second surface 6800 close to the pump axis and configured to receive and absorb the pump light 6030 emitted from the second surface 6800.

In detail, oppositely faced two of the reflection surfaces of the dielectric block 6000 are wedged with a down-tapered aperture perpendicular to the pump axis, each having a wedge angle of α, as shown in FIG. 7. The laser gain material 6040 is installed before a reflecting mirror 6070 along the pump axis for transmitting the pump light 6030. The reflecting mirror 6070 reflects an unabsorbed portion of the pump light 6030 back to the laser gain material 6040, so as to increase the pump absorption in the laser gain material 6040. The reflecting mirror 6070 has a curved radius of curvature to focus the reflected lights into the laser gain material 6040.

With reference to FIG. 8 of the 6th embodiment, a laser pumping system includes the pump-light sources 7010, 7012, the dielectric blocks 7100, 7200, and the laser gain material 7040. The pump-light source 7010 with the dielectric block 7100 and the pump-light source 7012 with the dielectric block 7200 are disposed on two sides of the laser gain material 7040.

The pump-light source 7010 is configured to emit a pump light 7130. The pump-light source can be light-emitting diodes, laser diodes, or a combination of the two. The dielectric block 7100 with the pump axis includes the first surface 7700, the second surface 7800, and a plural number of reflection surfaces, which are disposed about the pump axis and between the first surface 7700 and the second surface 7800. The dielectric block 7100 is configured to receive the pump light 7130 into the first surface 7700, guide the pump light 7130 along the pump axis surrounded by the reflection surfaces, and transmit the pump light 7130 toward the second surface 7800. The laser gain material 7040 is installed at a position next to the second surface 7800 close to the pump axis and configured to receive and absorb the pump light 7130 emitted from the second surface 7800. The pump-light source 7012 is configured to emit the pump light 7230. The dielectric block 7200 with the pump axis includes the first surface 7720, the second surface 7820, and a plural number of reflection surfaces, which are disposed about the pump axis and between the first surface 7720 and the second surface 7820. The dielectric block 7200 is configured to receive the pump light 7230 into the first surface 7720, guide the pump light 7230 along the pump axis surrounded by the reflection surfaces, and transmit the pump light 7230 toward the second surface 7820. The laser gain material 7040 is installed at a position next to the second surface 7820 close to the pump axis and configured to receive and absorb the pump light 7230 emitted from the second surface 7820.

In detail, oppositely faced two of the reflection surfaces of each of the dielectric blocks 7100 and 7200 are wedged with a down-tapered aperture perpendicular to the pump axis, each having a wedge angle of α, shown in FIG. 8. The dielectric blocks 7100 and 7200 are aligned with the respective pump axes intercepting at one point to concentrate the pump lights 7130 and 7230. The laser gain material 7040 is installed in a position of the pump lights 7130 and 7230 being concentrated to receive maximum pumping by the pump lights 7130 and 7230.

With reference to FIG. 9 of the 7th embodiment, a laser pumping system includes the cooling apparatuses 8010, 8020, the laser gain material 8040, the dielectric blocks 8100, 8200, 8300, 8400, 8500, 8600 and the respective pump-light sources. The pump-light sources corresponding to the dielectric blocks 8100, 8200, 8300, 8400, 8500, 8600 are configured to emit pump lights 8130, 8230, 8330, 8430, 8530, 8630, respectively. Each of the pump-light sources can be light-emitting diodes, laser diodes, or a combination of the two. The cooling apparatus 8010 can be a water cooling apparatus, which is attached to backsides of all the pump-light sources to remove the heat generated in the pump-light sources. The cooling apparatus 8020 is specifically a water cooling apparatus, which encloses the laser gain material 8040 to remove the heat generated in the laser gain material 8040. Alternatively, each of the cooling apparatuses 8010, 8020 can be one assisted by an air circulation or a Peltier thermoelectric cooler. Therefore, it helps to remove heats generated by the pump-light sources and the laser gain material.

In detail, oppositely faced two of the reflection surfaces of each of the dielectric blocks 8100, 8200, 8300, 8400, 8500, 8600 are wedged with a down-tapered aperture perpendicular to the pump axis, as shown in FIG. 9. The dielectric blocks 8100, 8200, 8300, 8400, 8500, 8600 are aligned with the respective pump axes intercepting at one point to concentrate the pump lights 8130, 8230, 8330, 8430, 8530, 8630. The laser gain material 8040 is installed in a position of the pump lights 8130, 8230, 8330, 8430, 8530, 8630 being concentrated to receive maximum pumping by the pump lights 8130, 8230, 8330, 8430, 8530, 8630. The contents of the laser pumping system of the 6th embodiment with FIG. 8 can be referred for the laser pumping system of the 7th embodiment with FIG. 9, and the other details of the laser pumping system of the 7th embodiment are omitted herein.

Although the present disclosure has been described in considerable details with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A laser pumping device, comprising:
a pump-light source, configured to emit a pump light;
a dielectric block with a pump axis, comprising a first surface, a second surface, and a plural number of reflection surfaces, wherein the first surface is a planar surface, the dielectric block is configured to receive the pump light into the first surface, guide the pump light along the pump axis surrounded by the reflection surfaces, and transmit the pump light toward the second surface, and oppositely faced two of the reflection surfaces are wedged with a down-tapered aperture perpendicular to the pump axis; and
a laser gain material, installed at a position next to the second surface close to the pump axis and configured to receive and absorb the pump light emitted from the second surface;
wherein a length L of the dielectric block along the pump axis is calculated from $$L = \sum_{i=1}^{N} x_i, \text{ where } x_i = \frac{d_i \tan(\theta + (2i-1)\alpha)}{1 - \tan\alpha \tan(\theta + (2i-1)\alpha)} \text{ and}$$

$$d_i = d_{i-1} + 2x_{i-1}\tan\alpha, \, d_0 = d, \, d_N = D, \, \theta \geq \theta_C$$

with α being a wedge angle, θ being the last incident angle of the pump light on the oppositely faced two reflection surfaces, $\theta_c$ being a critical angle of total internal reflection for the dielectric block, D being a width of the first surface, d being a width of the second surface, and N being a maximum integer number of i subject to a maximum $i^{th}$ width section $d_i=D$ at the first surface.

2. The laser pumping device of claim 1, wherein the pump-light source comprises an array of light-emitting diodes, or an array of laser diodes, or an array of mixed light-emitting-diodes and laser diodes.

3. The laser pumping device of claim 1, wherein a material of the dielectric block is transparent to the pump light and is one among glass, quartz, and fused silica.

4. The laser pumping device of claim 1, wherein at least one of the first and second surfaces of the dielectric block is optically coated with anti-reflecting dielectric layers to increase a transmission of the pump light through the dielectric block.

5. The laser pumping device of claim 1, wherein the first surface of the dielectric block is optically coated with dielectric layers having materials different from a material of the dielectric block to stimulate an emission of the pump light at an absorption wavelength of the laser gain material.

6. The laser pumping device of claim 1, wherein the laser gain material is one among Nd:YAG, Nd:YVO$_4$, Nd:GdVO$_4$, Nd:KGW, Nd:YLF, Nd:glass, Cr:YAG, Cr:LiSAF, Yb:YAG, Yb:glass, Er:YAG, Er:glass, Tm:glass, and Ti:sapphire crystals.

7. The laser pumping device of claim 1, wherein the laser gain material is installed before a reflecting mirror along the pump axis, which recycles an unabsorbed portion of the pump light back to the laser gain material.

8. The laser pumping device of claim 1, wherein the laser gain material is installed in a laser cavity.

9. The laser pumping device of claim 1, wherein the laser gain material is installed in a laser amplifier.

10. A laser pumping system, comprising:
a plural number of the pump-light sources of claim 1, configured to respectively emit a plural number of the pump lights;
a plural number of the dielectric blocks of claim 1, configured to respectively transmit the pump lights and insulate heat of the pump-light sources;
the laser gain material of claim 1, configured to receive and absorb the pump lights; and
a cooling apparatus, configured to remove heats generated in the pump-light sources and the laser gain material.

11. The laser pumping system of claim 10, wherein each of the pump-light sources comprises an array of light-emitting diodes, or an array of laser diodes, or an array of mixed light-emitting-diodes and laser diodes.

12. The laser pumping system of claim 10, wherein the dielectric blocks are aligned with the respective pump axes intercepting at one point to concentrate the pump lights.

13. The laser pumping system of claim 10, wherein the laser gain material is installed in a position of the pump lights being concentrated to receive maximum pumping.

14. The laser pumping system of claim 10, wherein the cooling apparatus comprises at least one of an air cooling element, a Peltier thermoelectric cooler, and a water cooling element attached to a backside of at least one of the pump-light sources.

15. The laser pumping system of claim 10, wherein the cooling apparatus comprises a water cooling pipe enclosing the laser gain material.

* * * * *